US010304559B2

(12) United States Patent
Naik et al.

(10) Patent No.: US 10,304,559 B2
(45) Date of Patent: May 28, 2019

(54) MEMORY WRITE VERIFICATION USING TEMPERATURE COMPENSATION

(71) Applicant: WESTERN DIGITAL TECHNOLOGIES, INC., Irvine, CA (US)

(72) Inventors: Himanshu Hemant Naik, San Jose, CA (US); Biswajit Ray, Santa Clara, CA (US); Mohan Vamsi Dunga, Santa Clara, CA (US); Changyuan Chen, San Ramon, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/395,279

(22) Filed: Dec. 30, 2016

(65) Prior Publication Data

US 2018/0189135 A1 Jul. 5, 2018

(51) Int. Cl.
| | | |
|---|---|---|
| *G06F 11/10* | (2006.01) | |
| *G11C 29/52* | (2006.01) | |
| *G11C 16/34* | (2006.01) | |
| *G11C 16/26* | (2006.01) | |
| *G11C 7/04* | (2006.01) | |
| *G11C 11/56* | (2006.01) | |
| *G11C 29/02* | (2006.01) | |

(52) U.S. Cl.
CPC .......... *G11C 29/52* (2013.01); *G06F 11/1072* (2013.01); *G11C 7/04* (2013.01); *G11C 11/5642* (2013.01); *G11C 16/26* (2013.01); *G11C 16/3436* (2013.01); *G11C 29/021* (2013.01); *G11C 29/028* (2013.01)

(58) Field of Classification Search
CPC ................................................. G06F 11/1076
USPC .................... 714/764, 718, 710, 24
See application file for complete search history.

(56) References Cited

U.S. PATENT DOCUMENTS

| | | | | |
|---|---|---|---|---|
| 5,168,499 A | * | 12/1992 | Peterson | G06F 7/02 714/30 |
| 5,377,109 A | * | 12/1994 | Baker | G05B 9/03 340/945 |
| 8,296,625 B2 | | 10/2012 | Diggs et al. | |
| 8,472,274 B2 | | 6/2013 | Fai et al. | |
| 8,687,421 B2 | | 4/2014 | Avila et al. | |
| 9,202,579 B2 | | 12/2015 | Hsiung et al. | |
| 2008/0037157 A1 | * | 2/2008 | Yang | G11B 5/6005 360/77.14 |
| 2012/0239976 A1 | * | 9/2012 | Cometti | G11C 16/10 714/24 |
| 2013/0173970 A1 | * | 7/2013 | Kleveland | G11C 29/44 714/710 |
| 2014/0226412 A1 | | 8/2014 | Yeh et al. | |
| 2015/0288722 A1 | * | 10/2015 | Sweet | H04L 63/0428 726/1 |

(Continued)

*Primary Examiner* — Fritz Alphonse
(74) *Attorney, Agent, or Firm* — Michael Best & Friedrich LLP

(57) ABSTRACT

A device is disclosed that includes a data write engine configured to store data into a block of a memory. The device also includes a post-write read engine configured to adjust a read voltage responsive to an output of the temperature sensor and to read stored data from the block based on the adjusted read voltage to verify integrity of the data. The device also includes a block manager configured to initiate a corrective operation responsive to an error characteristic of the data read from the block.

20 Claims, 4 Drawing Sheets

(56) References Cited

U.S. PATENT DOCUMENTS

2015/0310938 A1 10/2015 Kim et al.
2017/0200492 A1* 7/2017 Yang .................. G11C 11/5642

* cited by examiner

MEMORY WRITE VERIFICATION USING TEMPERATURE COMPENSATION

FIELD OF THE DISCLOSURE

This disclosure is generally related to data storage devices and more particularly to temperature compensation techniques.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate (BER) of data stored at the memory device may also increase.

Data written to a non-volatile memory device may be verified after programming the data into a group of storage elements, such as an erase block of a flash memory, using a post-write read operation or "enhanced" post-write read (EPWR) operation that reads the data from the group of storage elements and performs an error check on the read data. If the BER of the freshly-written data that is read from the group of storage elements exceeds an allowable amount, the group of storage elements may be marked for non-use, such as by being added to a "bad blocks list," and the data may be re-written to another group of storage elements for storage. However, because some of the errors may be due to temporary temperature effects on the storage elements rather than due to physical defects or device wear, a group of storage elements may be prematurely removed from use, resulting in a reduced capacity and reduced useful life of the data storage device.

DETAILED DESCRIPTION

Devices and methods provide compensation for temperature effects when verifying that data has been successfully copied from or "folded" from a higher-reliability memory to a higher-density memory. For example, a folding operation may copy data from multiple blocks of a single-level-cell (SLC) memory to a single block of a multi-level cell (MLC) memory.

Successful folding of the data may be verified by reading the data from the block of the MLC memory to check the data integrity. Prior to reading the data, a "read temperature" of the MLC memory may be measured. One or more memory access parameters, such as read threshold voltages, may be adjusted based on the read temperature.

Figure 1:
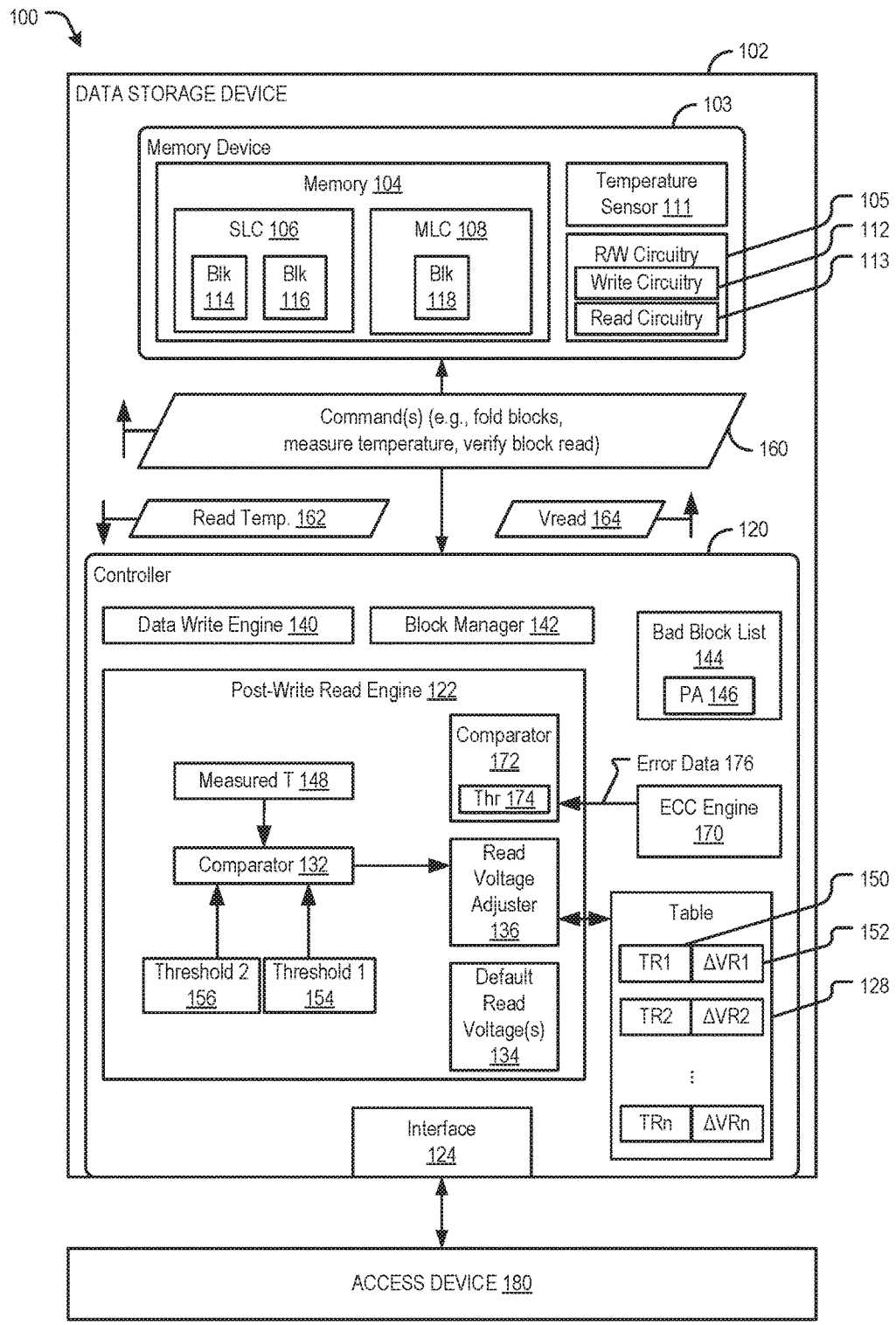
FIG. 1 is a block diagram of an illustrative example of a system including a data storage device configured to adjust memory access parameters based on temperature.

FIG. 1 depicts an illustrative example of a system 100 that includes a data storage device 102 and an access device 180 (e.g., a host device or another device). The data storage device 102 includes a post-write read engine 122 that is configured to perform compensation based on temperature when reading the data from the memory 104 as part of an EPWR operation.

The data storage device 102 and the access device 180 may be coupled via a connection (e.g., a communication path), such as a bus or a wireless connection. The data storage device 102 may include a first interface 124 (e.g., an access device or host interface) that enables communication via the communication path between the data storage device 102 and the access device 180.

The data storage device 102 may include or correspond to a solid state drive (SSD) which may be included in, or distinct from (and accessible to), the access device 180. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 180 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 180, such as in accordance with a Joint Electron Devices Engineering Council (JEDEC) Solid State Technology Association Universal Flash Storage (UFS) configuration. For example, the data storage device 102 may be configured to be coupled to the access device 180 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 180 (i.e., "removably" coupled to the access device 180). As an example, the data storage device 102 may be removably coupled to the access device 180 in accordance with a removable universal serial bus (USB) configuration.

The data storage device 102 may operate in compliance with an industry specification. For example, the data storage device 102 may include a SSD and may be configured to communicate with the access device 180 using a small computer system interface (SCSI)-type protocol, such as a serial attached SCSI (SAS) protocol. As other examples, the data storage device 102 may be configured to communicate with the access device 180 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 180 may include a memory interface (not shown) and may be configured to communicate with the data storage device 102 via the memory interface to read data from and write data to the memory device 103 of the data storage device 102. For example, the access device 180 may be configured to communicate with the data storage device 102 using a SAS, SATA, or NVMe protocol. As other examples, the access device 180 may operate in compliance with a Joint Electron Devices Engineering Council (JEDEC) industry specification, such as a Universal Flash Storage (UFS) Access Controller Interface specification. The access device 180 may communicate with the memory device 103 in accordance with any other suitable communication protocol.

The access device 180 may include a processor and a memory. The memory may be configured to store data and/or instructions that may be executable by the processor. The memory may be a single memory or may include multiple memories, such as one or more non-volatile memories, one or more volatile memories, or a combination thereof. The access device 180 may issue one or more commands to the data storage device 102, such as one or more requests to erase data, read data from, or write data to the memory device 103 of the data storage device 102. For example, the access device 180 may be configured to provide data to be stored at the memory device 103 or to request data to be read from the memory device 103. The access device 180 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage range in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line or as a multi-level-cell (MLC) word line. For example, in a SLC configuration each storage element may be configured to store a single bit of data, also known as a single bit-per-cell (BPC) configuration. In a MLC configuration, each storage element may be configured to store multiple bits of data, such as a 2-BPC configuration, a 3-BPC configuration, or a configuration that stores 4 or more bits per storage element.

The memory 104 is illustrated as including a SLC portion 106 (e.g., a single-bit-per-cell storage) and a MLC portion 108 (e.g., a multiple bits-per-cell storage). For example, the SLC portion 106 may be used as a non-volatile cache to store data in a faster-access, higher-reliability configuration, and the MLC portion 108 may be used for higher-density storage. Data received from the controller 120 may be stored in the SLC portion 106, such as in representative blocks 114 and 116. The data from the multiple SLC blocks 114 and 116 may later be copied or "folded" into a single block 118 of the MLC portion 108, such as during a background operation. The blocks 114-118 may correspond to erase blocks or may correspond to other groupings of storage elements of the memory 104. Although the SLC portion 106 and the MLC portion 108 may be implemented as physically distinct portions of the memory 104, such as separate dies, partitions, arrays, planes, etc., in other implementations the SLC portion 106 may be interspersed with the MLC portion 108. For example, the controller 120 may designate a storage configuration (e.g., SLC or MLC) for each block of the memory 104 and may modify the designated storage configurations during the life of the data storage device, such as for wear-leveling purposes.

The memory device 103 may include support circuitry, such as read/write circuitry 105, to support operation of one or more memory dies of the memory device 103. The read/write circuitry 105 may include write circuitry 112 and read circuitry 113. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory device 103 may also include a temperature sensor 111. For example, the temperature sensor 111 may be configured to measure a temperature and may be configured to provide an indication of the measured temperature to the controller 120, such as a read temperature 162. For example, the temperature sensor 111 may be responsive to one or more commands 160, such as a command to measure temperature. The memory device 103 may include a single temperature sensor 111, or may include multiple temperatures sensors. For example, in an implementation with a memory device 103 that includes multiple memory dies, each of the multiple memory dies may include a separate temperature sensor 111. Each of the temperature sensors 111 may be independently polled by the controller 120 to provide a respective temperature 162 for the associated memory die.

The controller 120 is coupled to the memory device 103 via a bus, an interface (e.g., interface circuitry), another structure, or a combination thereof. For example, the bus may include one or more channels to enable the controller 120 to communicate with a single memory die of the memory device. As another example, the bus may include multiple distinct channels to enable the controller 120 to communicate with each memory die of the memory device 103 in parallel with, and independently of, communication with other memory dies of the memory device 103.

The controller 120 is configured to receive data and instructions from the access device 180 and to send data to the access device 180. For example, the controller 120 may send data to the access device 180 via the first interface 124, and the controller 120 may receive data from the access device 180 via the first interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 may also be configured to send data and commands to the memory 104 associated with background scanning operations, garbage collection operations, and/or wear leveling operations, etc., as illustrative, non-limiting examples. The controller 120 is configured to send a read command to the memory 104 to access data from a specified address of the memory 104. The read command may specify the physical address of a portion of the memory 104 (e.g., a physical address of a word line of the memory 104).

The controller 120 includes a data write engine 140, a post-write read engine 122, a block manager 142, an ECC engine 170, and a data structure (e.g., a table 128) that associates temperature ranges to post-write read voltage parameters. The ECC engine 170 is configured to receive data to be stored to the memory 104 and to generate a codeword. For example, the ECC engine 170 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 170 may include one or more decoders coupled to the post-write read engine 122 and configured to decode data read from the memory 104 to detect and correct, up to an error correction capability of the ECC scheme, any bit errors that may be present in the data.

The block manager 142 may be configured to select one or more blocks of the memory 104 to store data, such as by selecting the blocks 114, 116 to store data and selecting the block 118 for storing the data from the blocks 114, 116 during a folding operation. The block manager 142 may also be configured to initiate a corrective operation responsive to an error characteristic of data read from a block during a post-write read operation. For example, the block manager 142 may be configured to mark a block as invalid and to initiate storage of the data at another block in response to data read from the block during a post-write read operation having an error metric from the ECC engine that exceeds a threshold 174. For example, a comparator 172 of the post-write read engine 122 may compare a number of errors indicated in error data 176 to the threshold 174 and may generate a signal to the block manager 142 in response to the number of errors exceeding the threshold 174.

The block manager 142 may be configured to maintain information of blocks that are to remain unused, such as a bad block list 144. In some implementations, blocks indicated in the bad block list 144 are mapped out of the available physical memory of the data storage device 102 as unsuitable for storage of data. In some implementations, the block manager 142 may be configured to designate a block as suitable for SLC storage but unsuitable for MLC storage. In some implementations, the block manager 142 may be configured to designate a block as partial good block.

The data write engine 140 is configured to store data into the memory 104. For example, the data write engine 140 may be configured to store data into the SLC portion 106 according to a single bit-per-cell storage. As another example, the data write engine 140 is configured to store data into a block of the MLC portion 108 of the memory 104 according to a multiple bits-per-cell storage. The data write engine 140 may be configured to store data into the MLC portion 108 by causing the R/W circuitry 105 to perform a folding operation to copy data from the SLC portion 106 to the MLC portion 108. In some implementations, the data write engine 140 is configured to store data to the MLC portion 108 via direct write to the MLC portion 108 (i.e., without first writing the data to the SLC portion 106).

The post-write read engine 122 is configured to adjust one or more read voltages based on read temperature for an EPWR of data written into the memory 104. For example, the post-write read engine 122 may be configured to adjust a read voltage responsive to an output of the temperature sensor 111 to read stored data from the MLC portion 108 based on the adjusted read voltage to verify integrity of the data.

The post-write read engine 122 may include a comparator 132 configured to compare a measured temperature 148 to one or more thresholds, illustrated as a first threshold 154 and a second threshold 156. The measured temperature 148 may correspond to an output of the temperature sensor 111. For example, after the data write engine 140 has caused data to be stored to the block 118 of the MLC portion 108, the controller 120 may instruct the temperature sensor 111 to perform a measurement operation and to provide the read temperature 162 to the controller 120. The measured temperature 148 may match the read temperature 162 or may otherwise correspond to the read temperature 162 (e.g., having modified precision, scaled, or offset as compared to the read temperature 162, adjusted based on an average of multiple temperature readings, etc.). The post-write read engine 122 may perform one or more comparisons at the comparator 132 to determine a temperature range corresponding to the measured temperature 148. For example, the comparator 132 may determine whether the measured temperature 148 is in a first temperature range that includes temperatures less than or equal to the first threshold 154, in a second temperature range that includes temperatures between the first threshold 154 and the second threshold 156, or in a third temperature range that includes temperatures greater than or equal to the second threshold 156.

The post-write read engine 122 may include a read voltage adjuster 136 configured to use a temperature range determined by the comparator 132 to determine an index into the table 128. For example, the table 128 may be a data structure that includes a first temperature range (TR1) 150 and one or more read voltage offsets ($\Delta$VR1) 152 that correspond to the first temperature range, a second temperature range (TR2) and one or more read voltage offsets ($\Delta$VR1) that correspond to the second temperature range, and an n-th temperature range (TRn) and one or more read voltage offsets ($\Delta$VRn) that correspond to the n-th temperature range, as described in further detail with reference to FIG. 2.

The read voltage adjuster 136 may be configured to adjust one or more parameters used during reading data from the memory 104 as part of an EPWR operation to verify integrity of the data. For example, the read voltage adjuster 136 may be configured to retrieve one or more read offset values from the table 128 based on a temperature of the memory 104. The read voltage adjuster 136 may be configured to apply the one or more read voltage offsets to one or more default read voltages 134 to set a temperature-compensated read voltage for an EPWR operation.

During operation, the controller 120 may receive data from the access device 180 to be stored in the memory 104. The block manager 142 may identify the blocks 114, 116 in the SLC portion 106 for storing the data, and the data write engine 140 may store the data into the blocks 114, 116. For example, ECC engine 170 may process the data to generate ECC codewords, and the data write engine 140 may send one or more commands 160 and the ECC codewords to the write circuitry 112 to cause the ECC codewords to be stored into the blocks 114, 116.

After the blocks 114, 116 have been filled, the block manager 142 may identify the block 118 in the MLC portion 108 as a destination block for a data folding operation. The data write engine 140 may copy the data from the blocks 114, 116 to the block 118. For example, the data write engine 140 may send one or more commands to cause the read circuitry 113 to read a page of data from a first word line of the first block 114 and page of data from a first word line of the second block 116 into a set of latches of the memory device 103. The data write engine 140 may send one or more commands to cause the write circuitry 112 to program the two pages of data from the latches into a single page of the first word line of the block 118 in a 2-BPC storage configuration. For example, the data write engine 140 may send a first command to copy data from the first block 114 to the latches, a second command to copy data from the second block 116 to the latches, and a third command to program the data from the latches into the block 118 in a 2-BPC configuration.

The data write engine 140 may repeat the first, second, and third commands for each page of each word line of the blocks 114, 116. In other implementations, the data write engine 140 may send a single folding command that identifies the source blocks 114, 116 and the destination block 118, and in response the read/write circuitry 105 performs the data folding operation autonomously (i.e., in the absence of further commands from the controller 120).

After completing the folding operation, or while the folding operation is ongoing, the post-write read engine 122 may cause the controller 120 to instruct the temperature sensor 111 to send the read temperature 162 to the post-write read engine 122. A temperature range corresponding to the read temperature 162 may be determined via one or more comparisons at the comparator 132 and may be used by the read voltage adjuster 136 to retrieve a set of read voltage offsets from the table 128. The read voltage adjuster 136 may apply (e.g., add or subtract) offsets of the set of offsets to corresponding default read voltages 134 to determine temperature-adjusted post-write read voltage(s) (Vread) 164 for the post-write read operation.

The read voltage adjuster 136 may also be configured to apply one or more read voltage adjustments based on a count of write/erase cycles of the destination block 118 or based on another block health metric. For example, a relatively high number of program operations or erase operations applied to a memory cell may cause statistically predictable changes to the memory cell's electrical characteristics (e.g., a threshold voltage shift). In implementations where the read voltage adjuster 136 is configured to adjust one or more read voltages based on a count of write/erase cycles or other health metric, such adjustments may be computed on-the-fly by the read voltage adjuster 136 or determined via accessing a look-up table (not shown) storing block health-related offset values.

The post-write read engine 122 may send the temperature-adjusted post-write read voltage(s) 164 to the memory device 103 and a read instruction for reading the folded data from the destination block 118 to verify integrity of the data. The read circuitry 113 may be responsive to the read instruction from the post-write read engine 122 to read the data from the block 118 using the temperature-adjusted post-write read voltage(s) 164. The post-write read engine 122 may perform a post-write read operation that includes sequentially reading each page of data from the destination block 118 (e.g., by sending a sequence of read instructions to the read circuitry 113) and checking the page for errors (e.g., at the ECC engine 170) to determine an error characteristic of the data read from the destination block. To illustrate, each page may be processed by the ECC engine 170 to determine an error metric associated with the page, such as a syndrome weight, error count (e.g., failed bit count (FBC)), estimated bit error rate, or actual bit error rate, as illustrative, non-limiting examples. Error data 176 generated by the ECC engine 170 may be provided to the post-write read engine 122 and compared to an error threshold 174.

In some implementations, if the error data 176 indicates an error count or error rate that exceeds a first threshold amount, the post-write read engine 122 may send a signal to the block manager 142 indicating a first error characteristic of the destination block 118. In response to receiving the signal indicating the first error characteristic, the block manager 142 may perform a corrective operation that results in the block 118 not being used (or, in some implementations, not being used for MLC data storage). The block manager 142 may identify another destination block in the MLC portion 108 and re-initiate the folding operation to the new destination block via the data write engine 140 and the post-write read engine 122. The block manager 142 may also add an indicator of the block 118 to the bad block list 144, such as a physical address (PA) 146 or other identifier of the block 118.

In some implementations, if the error data 176 indicates an error count or error rate that exceeds a second threshold amount but does not exceed the first threshold amount, the post-write read engine 122 may send a signal to the block manager 142 indicating a second error characteristic of the destination block 118. In response to receiving the signal indicating the second error characteristic, the block manager 142 may perform a corrective operation that results in the block 118 not being used for future data storage (or, in some implementations, not being used for future MLC data storage). The block manager 142 may allow continued read access to the data in the block 118 but may mark the block as unreliable for future data programming. After the data in the block 118 has become invalid, the block manager 142 may add an indicator of the destination block 118 to the bad block list 144.

In some implementations, if the error data 176 indicates an error count or error rate that exceeds a third threshold amount but does not exceed the second threshold amount, the post-write read engine 122 may send a signal to the block manager 142 indicating a third error characteristic of the destination block 118. In response to receiving the signal indicating the third error characteristic, the block manager 142 may perform a corrective operation that updates an EPWR error history of the block 118. The block manager 142 may evaluate the EPWR error history of the block 118 to estimate whether the block 118 is predicted for early failure, such as if the error history shows a trend of increasing EPWR error rates that can be extrapolated to predict that a next EPWR error rate of the block 118 will exceed the first threshold amount or the second threshold amount. In response to determining that the EPWR error history indicates that the block 118 is predicted for early failure, the data manager 142 may allow continued read access to the data in the block 118 but may mark the block 118 as unreliable for future data programming, and after the data in the block 118 has become invalid, the block manager 142 may add an indicator of the destination block 118 to the bad block list 144. Alternatively or in addition, the block manager 142 may adjust a health metric of the block 118 to bypass selection of the block 118 for future programming in favor of other blocks having stronger health metrics.

By performing one or more adjustments to read voltages during EPWR operations based on a temperature of the memory 104, an accuracy of verifying the MLC data written to the memory 104 may be increased. As a result, blocks are less likely to be identified as unusable, and a capacity and useful life of the data storage device 102 may be increased as compared to not using temperature compensation during EPWR operations.

Various modifications to the described implementation may be incorporated in other implementations. For example, although FIG. 1 illustrates the data write engine 140, the post-write read engine 122, and the ECC engine 170 as components of the controller 120, in other implementations functionality of one or more of the data write engine 140, the post-write read engine 122, or the ECC engine 170 may be implemented at the memory device 103. For example, the memory device 103 may include at least one of the data write engine 140 or the post-write read engine 122, which may be implemented as one or more state machines or circuitry configured to perform operations attributed to the data write engine 140 or the post-write read engine 122. The error data 176 may be generated via circuitry at the memory device 103, such as syndrome generation circuitry, without implementing a full ECC decoder at the memory device 103.

As another example, although the data storage device 102 may perform a temperature-compensated post-write read operation for the MLC block 118 but not for the SLC blocks 114, 116, in other implementations the data storage device 102 may be configured to also perform temperature-compensated post-write read operations for the SLC blocks 114, 116. Although the folding operation is described as performed on "full" SLC blocks 114, 116 to copy the stored data to the MLC block 118, in some implementations a data folding operation may be performed using partially-filled blocks. The 2-BPC MLC configuration described in FIG. 1 may be replaced in other implementations with a 3-BPC configuration, a 4-BPC configuration, or a configuration that includes a higher number of bits per storage element. For example, in a 3-BPC MLC implementation, data from three blocks in the SLC portion 106 may be folded into a single block in the MLC portion 108.

Although the data structure storing the read voltage offsets is depicted as the table 128 including multiple sets of read voltage offsets corresponding to multiple temperature ranges, in other implementations the data structure may be implemented as a linked list, "flat" file, a set of dedicated registers or latches, or other data structure other than a table. Alternatively, or in addition, the data structure may include offset voltage information associated with a single temperature range, with two temperature ranges, or with more than two temperature ranges. An illustrative implementation of such a data structure is described in further detail with reference to FIG. 2.

Figure 2:
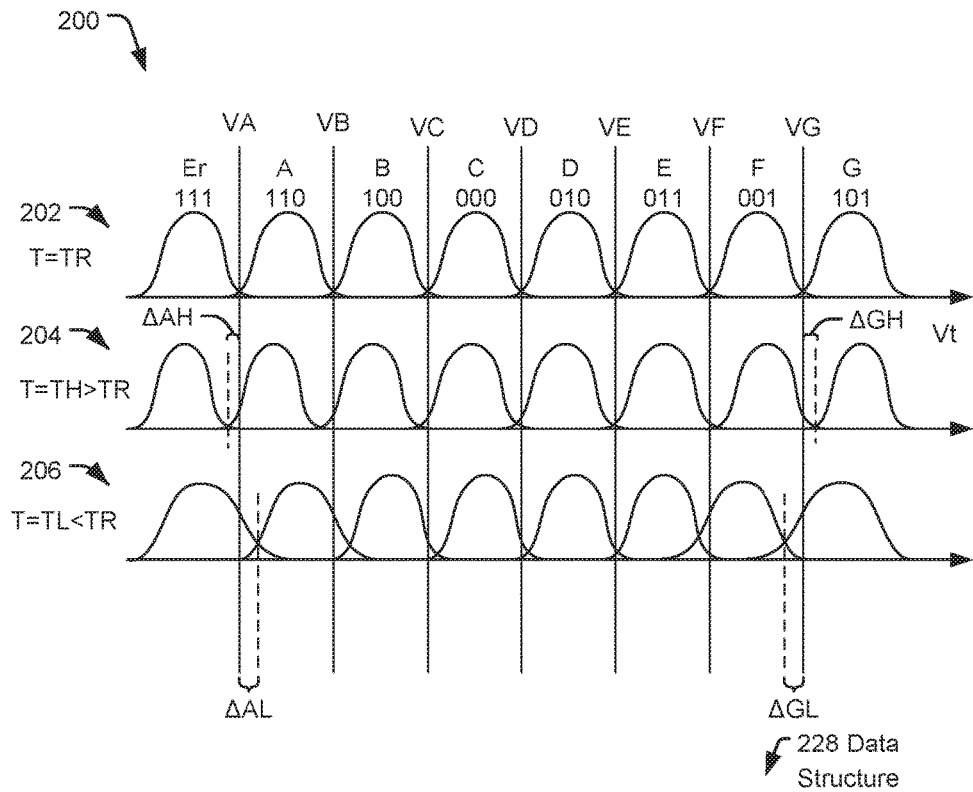
FIG. 2 is a diagram illustrating a particular example of states of storage elements and a table that may be used by the data storage device of FIG. 1.

FIG. 2 depicts an example 200 of storage states of storage elements at various temperatures and an example of entries in a data structure 228 (e.g., the table 128) that may be implemented in the data storage device 102 of FIG. 1. A first graph 202 illustrates an example of a charge voltage distribution (CVD) of storage elements in a 3-BPC storage configuration having 8 storage states labelled Erase (Er), A, B, C, D, E, F, and G. Each of the states Er through G is associated with a 3-bit value indicating data stored in the storage elements. In the graph 202, the Er state corresponds to a "lobe" or histogram distribution of threshold voltages (Vt) of storage elements (e.g., flash memory cells) having a lowest threshold voltage range, the A state corresponds a lobe of storage elements with threshold voltages in a next-higher threshold voltage range, and the G state corresponds to a lobe of storage elements with threshold voltages in a highest voltage range.

Data can be read from the storage elements by applying one or more read voltages VA, VB, VC, VD, VE, VF, or VG to a control gate of the storage elements and determining whether individual storage elements are activated (e.g., conducting current) or not activated (e.g., substantially non-conductive) responsive to the applied read voltage. The read voltages VA through VG are selected to coincide with the intersections of the lobes to reduce or minimize the number of erroneously read storage elements. For example, a storage element originally programmed to store "101" (state G) but whose threshold voltage is less than VG will be read as storing "001" (state F).

The first graph 202 illustrates an example CVD and "optimal" read voltages for storage elements at a temperature that is in a temperature range "TR" that may include "room temperature" (e.g., a temperature range from 0 degrees Celsius to 50 degrees Celsius). A second graph 204 illustrates a CVD for the same storage elements at a temperature that is in a temperature range "TH" that includes temperatures higher than TR (e.g., a temperature range from 50 degrees Celsius to 85 degrees Celsius). A third graph 206 illustrates a CVD for the same storage elements at a temperature that is in a temperature range "TL" that includes temperatures lower than TR (e.g., a temperature range from 0 degrees Celsius to −25 degrees Celsius).

As illustrated in the second graph 204, at relatively higher temperatures one or more lobes may narrow and shift as compared to the first graph 202. For example, the Er lobe may shift to lower voltages and the G lobe may shift to higher voltages. "Optimal" read voltages for the second graph 204 may coincide with the intersections of the lobes in the second graph 204 and may be offset relative to the illustrated voltages VA through VG. For example, the intersection of lobes Er and A in the second graph 204 is offset from VA by an amount "ΔAH," and the intersection of lobes F and G in the second graph 204 is offset from VG by an amount "ΔGH." Although offsets are illustrated for VA and VG, offsets may be determined for any or all of the read voltages VA through VG.

As illustrated in the third graph 206, at relatively lower temperatures one or more lobes may widen and shift as compared to the first graph 202. For example, the Er lobe may shift to higher voltages and the G lobe may shift to lower voltages. "Optimal" read voltages for the third graph 206 may coincide with the intersections of the lobes in the third graph 206 and may be offset relative to the illustrated voltages VA through VG. For example, the intersection of lobes Er and A in the third graph 206 is offset from VA by an amount "ΔAL," and the intersection of lobes F and G in the third graph 206 is offset from VG by an amount "ΔGL."

One or more read voltage offsets for one or more of the temperature ranges may be used by the post-write read engine 122 of FIG. 1 to at least partially compensate for temperature effects on the storage states of recently-programmed storage elements of a multiple bits-per-cell storage. For example, the table 128 of FIG. 1 may include a first read voltage offset (e.g., ΔAH) corresponding to a first temperature range (e.g., TH) and associated with a first storage state (e.g., Er) of the multiple bits-per-cell storage, and the table 128 may include a second read voltage offset (e.g., ΔGH) corresponding to the first temperature range (e.g., TH) and associated with a second storage state (e.g., G) of the multiple bits-per-cell storage. The table 128 may further include a third read voltage offset (e.g., ΔAL) and a fourth read voltage offset (e.g., ΔGL) corresponding to a second temperature range (e.g., TL).

The data structure 228 illustrates an example of a data structure that may be used as the table 128 of FIG. 1 and that includes temperature-based read voltage offsets for each of the read voltages at each of the temperature ranges TL, TR, and TH. As illustrated, the offsets for TR are "0," indicating that the default read voltages are to be used (without adjustment) for verifying data integrity at temperatures within the TR range. In the higher temperature range TH, the offsets for VA through VE are illustrated as having a negative sign, indicating that the offset shifts the read voltage to the left (a lower voltage), while the offsets for VF and VG are illustrated as shifting the read voltages to the right (a higher voltage). In the lower temperature range TL, the offsets for VA through VE are illustrated as shifting the read voltages to the right (a higher voltage), while the offsets for VF and VG are illustrated as having a negative sign, shifting the read voltages to the left (a lower voltage).

Although the data structure 228 is illustrated as including read voltage offsets for each of three temperature ranges, in other implementations the data structure may omit one or more temperature ranges or include one or more additional temperature ranges. For example, the data structure 228 may omit the '0' offset values for the temperature range TR. A number of temperature ranges may be determined based on an accuracy criterion, with a larger number of temperature ranges corresponding to a higher accuracy, while a smaller number of temperature ranges may reduce memory or hardware usage for the data structure 228 and may reduce complexity and latency associated with selecting read voltage offset values from the data structure 228.

Although the data structure 228 is illustrated as including eight read voltage offsets for each temperature range, in other implementations the data structure may omit one or more of the read voltage offsets or may include one or more additional read voltage offsets. For example, for a 2-BPC storage configuration, three read voltages may be used to read data from the storage elements, and the data structure 228 may include three read voltage offsets for each temperature range. As another example, for a 4-BPC storage configuration, fifteen read voltage offsets may be included for each temperature range. Additionally or alternatively, read voltage offsets having relatively small values (e.g., the magnitude of the offset for VE at either TL or TH may be small as compared to the magnitude of the offset for VA or VG) may provide relatively little accuracy improvement and may be omitted to conserve memory or hardware resources.

In some implementations, the number of temperature ranges, the values of the read voltage offsets for each temperature range, or a combination thereof, may be programmed at an initial configuration of a data storage device and may remain unchanged for the life of the data storage device. In other implementations, the number of temperature ranges, the values of the read voltage offsets for each temperature range, or a combination thereof, may be updated over the life of the data storage device, such as described with reference to FIG. 3.

Figure 3:
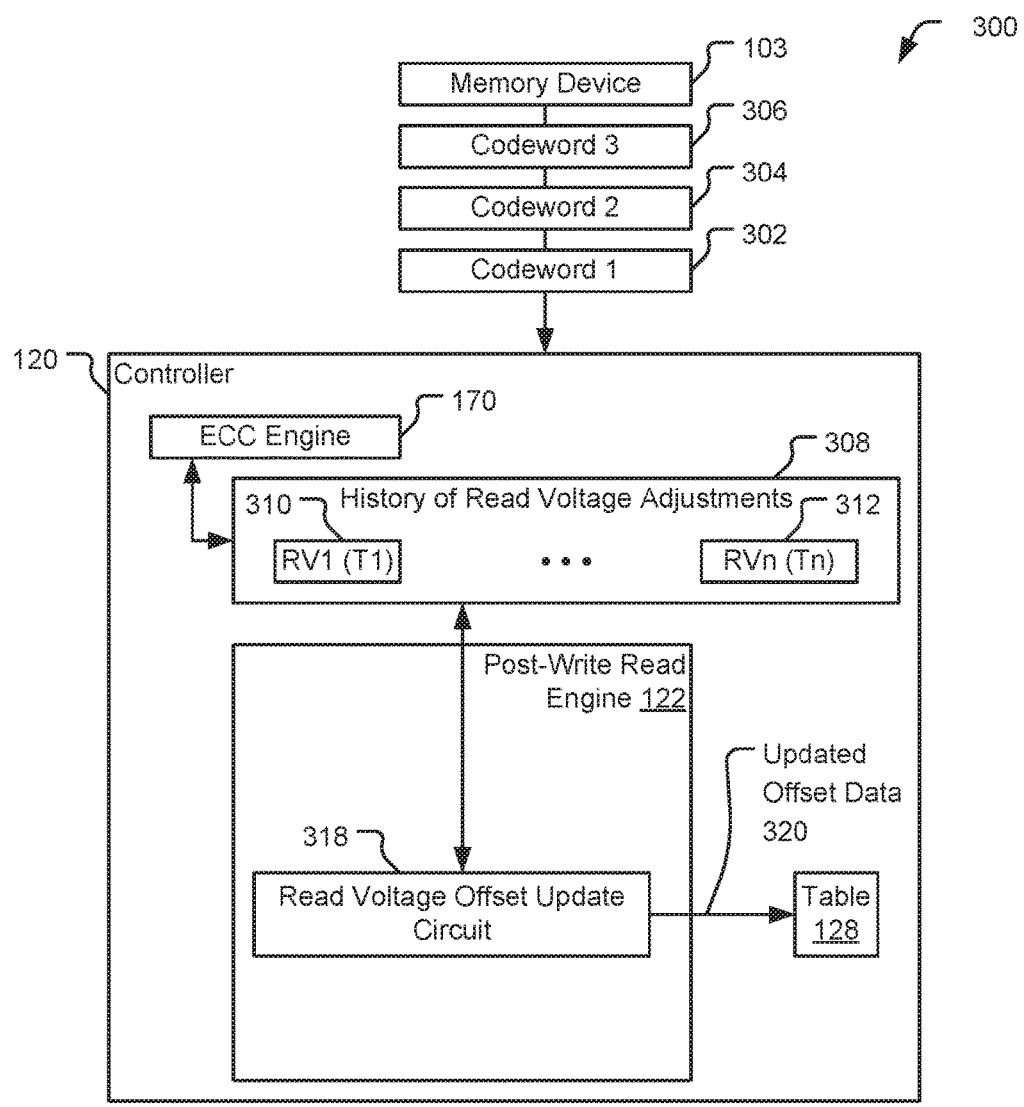
FIG. 3 is a block diagram of another illustrative example of the data storage device of FIG. 1.

FIG. 3 illustrates a data storage device 300 that includes the memory device 103 that is coupled to the controller 120. The memory device 103 and the controller 120 may include or correspond to the memory device 103 and the controller 120 of FIG. 1.

The controller 120 may include the ECC engine 170 and the post-write read engine 122. The controller 120 may be configured to read multiple codewords of data from the memory device 103. For example, the controller 120 may be configured to read a first codeword 302, a second codeword 304, and a third codeword 306 from the memory device 103. The codewords 302-306 are representative of data read as part of a post-write read integrity verification.

In some implementations the controller 120 is configured to update read voltages used for an EPWR operation upon detecting that a predetermined number of write/erase cycles have been performed at the memory device 103, such as when a cycle count of the block 118 equals the predetermined number. For example, the controller 120 may perform an update of the read voltages during an EPWR operation when the cycle count equals 100 write/erase cycles (or one or more multiples of 100 write/erase cycles) as an illustrative, non-limiting example. The controller 120 may determine an updated set of read voltages to re-read the codewords from the memory device 103 with reduced errors as part of the EPWR operation, such as by performing a CVD operation to identify minima in a threshold voltage distribution of the storage elements storing the data, or by performing a dynamic read operation that adjusts read voltages to reduce an error rate of the read data, as illustrative non-limiting examples. The resulting set of updated read voltages for the codewords, and a temperature associated with the memory device 103 when the codewords are read, may be stored in a history of read voltage adjustments 308. For example, a first entry 310 may associate a first set of read voltages (RV1) with a first temperature (T1), and an n-th entry 312 may associate an n-th set of read voltages (RVn) with an n-th temperature (Tn).

The post-write read engine 122 may include a read voltage offset update circuit 318 that is configured to access the history 308 and to generate updated read voltage offset data 320 to update values in the table 128. For example, the read voltage offset update circuit 318 may order the entries 310-312 by temperature and may select one or more temperature ranges based on values of the sets of read voltages of the entries. For example, the read voltage offset update circuit 318 may compare the generated read voltages for each entry 310-312 to the default read voltages 134 and may interpolate, extrapolate, or curve-fit the resulting data to identify a temperature range boundary, such as a boundary between TR (e.g., where no read voltage offset is to be applied during an EPWR) and TL or TH (where a read voltage offset is to be applied during an EPWR). After selecting boundaries between temperature ranges, the read voltage offset update circuit 318 may compare a largest difference between read voltage offsets within each temperature range (e.g., compare a largest offset for VA to a smallest offset for VA within a temperature range) and if the largest difference exceeds a threshold, the read voltage offset update circuit 318 may sub-divide the temperature range into two or more temperature ranges. Within each temperature range, the read voltage offset update circuit 318 may select a set of read voltage offset values, such as by selecting a median value of the read voltage offsets of the entries 310-312 corresponding to the temperature range, an arithmetic mean of the offset values of the entries 310-312 corresponding to the temperature range, a weighted average that assigns higher weight to more recent or more frequently occurring offset values of read voltages or temperatures, one or more other techniques, or a combination thereof.

By updating the table 128 with the updated offset data 320 based on the history of read voltage adjustments 308, the read voltage offsets used by the post-write read engine may adjust for changes in the memory device 103 over the lifetime of the memory device 103. As a result, temperature compensation by the post-write read engine 122 may provide greater accuracy over the lifetime of the data storage device 300.

Figure 4:
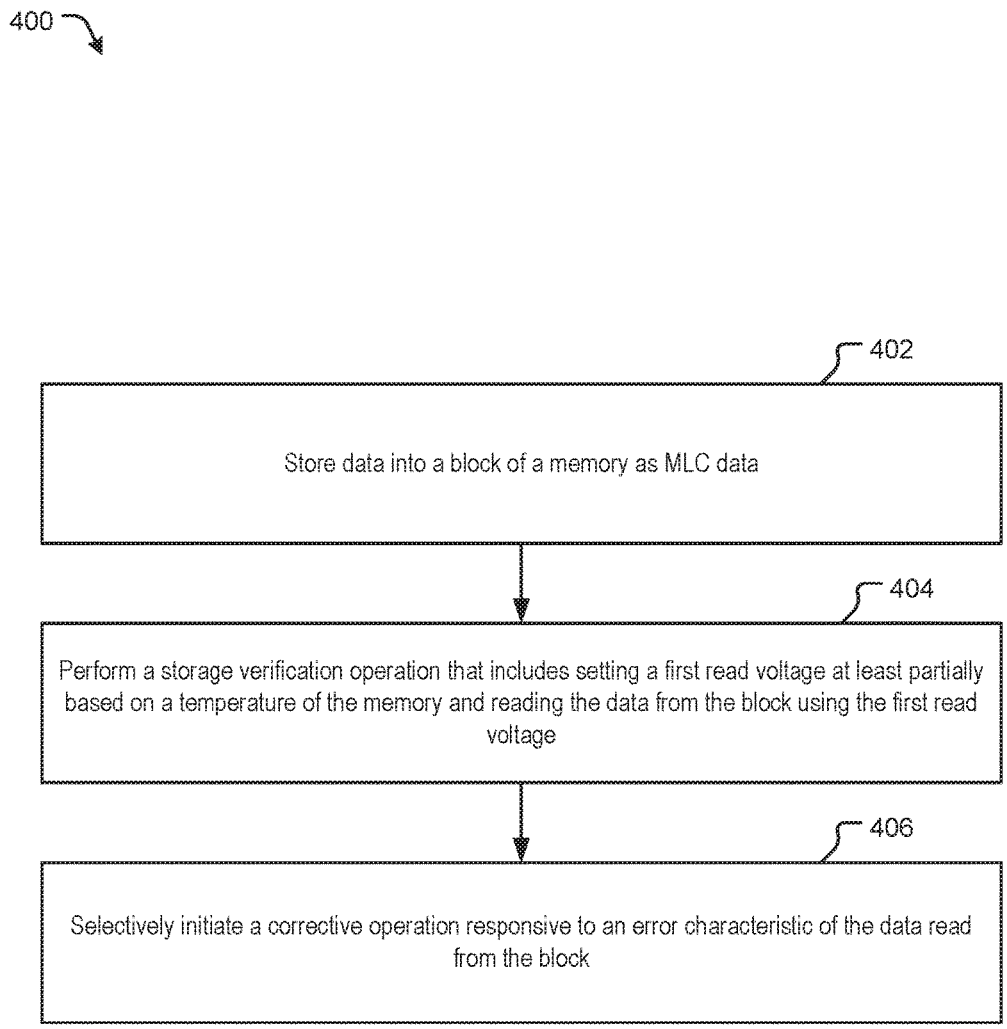
FIG. 4 is a flow diagram of a particular example of a method of refreshing data that may be performed by the data storage device of FIG. 1.

FIG. 4 is a flow diagram of a particular example of a method 400 of multi-level cell (MLC) data storage and verification. The method 400 may be performed at a data storage device that includes a non-volatile memory. For example, the method 400 may be performed by the data storage device 102 of FIG. 1.

The method 400 includes storing data into a block of a memory as MLC data, at 402. For example, the data write engine 140 may cause a folding operation to be performed to copy data from SLC blocks 114 and 116 into the MLC block 118 of FIG. 1.

A storage verification operation is performed, at 404. The storage verification operation includes setting a first read voltage at least partially based on a temperature of the memory and reading the data from the block using the first read voltage. To illustrate, an indication of the temperature may be received from a temperature sensor, such as the temperature sensor 111, and a first read voltage offset corresponding to the temperature may be retrieved from a look-up table, such as the table 128 of FIG. 1 or the data structure 228 of FIG. 2. The first read voltage may be set by the read voltage adjuster 136 and may include applying (e.g., adding) the first read voltage offset to a default value of the first read voltage (e.g., a default read voltage 134 of FIG. 1).

Performing the storage verification operation may also include setting a second read voltage at least partially based on the temperature, and reading the data from the block may use the first read voltage and the second read voltage. For example, setting the first read voltage may include applying a positive offset (e.g., $\Delta AL$ of FIG. 2) to a default value of the first read voltage (e.g., VA), and setting the second read voltage may include applying a negative offset (e.g., $-\Delta GL$ of FIG. 2) to a default value of the second read voltage (e.g., VG).

The method 400 includes selectively initiating a corrective operation responsive to an error characteristic of the data read from the block, at 406. For example, the error characteristic may correspond to error data associated with the data read from the block exceeding a threshold, and the corrective operation may include storing the data into another block of the memory. The corrective operation may further include setting an indicator to indicate that the block is not to be used for MLC data storage.

For example, the error data 176 from the ECC engine 170 of FIG. 1 may be compared by the comparator 172 to the threshold 174. In response to the error data exceeding the threshold, the block manager 152 may initiate the corrective operation to store the data into another block of the memory and to mark the block as "bad." For example, in response to the error data exceeding a threshold, an indicator (e.g., the physical address 146) may be set to indicate that the block is not to be used for MLC data storage.

In conjunction with the disclosed description, an apparatus is described that includes means for storing data in a multi-level-cell (MLC) configuration. For example, the means for storing data in a MLC configuration may correspond to the MLC portion 108 of FIG. 1, the block 118 of FIG. 1, one or more other groups of storage elements configured to store two or more bits of data per storage element, or any combination thereof.

The apparatus also includes means for adjusting a read voltage based on a temperature of the means for storing and for reading the stored data from the means for storing based on the adjusted read voltage to verify integrity of the stored data. For example, the means for adjusting the read voltage and for reading the stored data based on the adjusted read voltage may correspond to the post-write read engine 122 of FIG. 1, one or more other circuits or devices configured to adjust a read voltage and to initiate reading of data using the adjusted read voltage, or a combination thereof.

The apparatus also includes means for performing a corrective action responsive to non-integrity of the stored data. To illustrate, performing the corrective action may include updating a bad block list in response to error data generated for the data indicating a number of errors exceeding a threshold. For example, the means for performing the corrective action may correspond to the block manager 142 of FIG. 1, one or more other circuits or devices configured to performing a corrective action responsive to non-integrity of stored data, or a combination thereof.

The apparatus may include means for storing a first read voltage offset and a second read voltage offset corresponding to a first temperature range. For example, the means for storing the first read voltage offset and the second read voltage offset may correspond to a look-up table such as the table 128, the data structure 228, one or more registers, memory cells, circuits, or other devices configured to store data, or any combination thereof.

The apparatus may include means for generating error data corresponding to the data read from the means for storing. For example, the means for generating error data may correspond to the ECC engine 170, syndrome generation circuitry (e.g., an XOR tree), one or more other circuits or devices configured to process ECC encoded data to generate information regarding errors in the data, or any combination thereof.

Although the controller 120 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the method 400. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 120 may be performed at the memory device 103. As an illustrative example, in-memory ECC operations (e.g., syndrome generation) may be performed at the memory device 103 alternatively or in addition to performing such operations at the controller 120.

To further illustrate, the data storage device 102 may be configured to be coupled to the access device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 180) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
  a memory;
  a temperature sensor;
  a data write engine configured to store data into a block of the memory;
  a post-write read engine configured to adjust a read voltage responsive to an output of the temperature sensor and to read stored data from the block based on the adjusted read voltage to verify the data has been successfully stored in the block; and
  a block manager configured to initiate a corrective operation responsive to an error characteristic of the data read from the block.

2. The device of claim 1, further comprising a data structure accessible to the post-write read engine and including a first read voltage offset corresponding to a first temperature range.

3. The device of claim 2, the first read voltage offset associated with a first storage state of a multiple bits-per-cell storage, and the data structure including a second read voltage offset corresponding to the first temperature range and associated with a second storage state of the multiple bits-per-cell storage.

4. The device of claim 3, The data structure further including a third read voltage offset and a fourth read voltage offset corresponding to a second temperature range.

5. The device of claim 1, further comprising an error correction coding (ECC) engine coupled to the post-write read engine, and wherein the error characteristic corresponds to an error metric of the data from the ECC engine exceeding a threshold.

6. The device of claim 5, wherein the corrective operation includes marking the block as invalid and initiating storage of the data at another block.

7. The device of claim 5, wherein the corrective operation includes setting an indicator to indicate that the block is not to be used for data storage.

8. The device of claim 5, further comprising:
a controller that is coupled to the memory and that includes the data write engine, the post-write read engine, the ECC engine, and the block manager; and
a memory device that includes the memory and that further includes:
write circuitry responsive to a write instruction from the data write engine to store the data into the block; and
read circuitry responsive to a read instruction from the post-write read engine to read the data from the block.

9. The device of claim 1, further comprising a memory device that includes the memory and that includes at least one of the data write engine or the post-write read engine.

10. A method of data storage and verification, the method comprising:
in a data storage device that includes a memory, performing:
storing data into a block of the memory;
performing a storage verification operation that includes:
setting a first read voltage at least partially based on a temperature of the memory; and
reading the data from the block using the first read voltage to determine whether the data was successfully stored in the block; and
selectively initiating a corrective operation responsive to an error characteristic of the data read from the block.

11. The method of claim 10, wherein the error characteristic corresponds to error data associated with the data read from the block exceeding a threshold, and wherein the corrective operation includes storing the data into another block of the memory.

12. The method of claim 11, wherein the corrective operation further includes setting an indicator to indicate that the block is not to be used for multi-level cell (MLC) data storage.

13. The method of claim 10, further comprising:
receiving an indication of the temperature from a temperature sensor; and
retrieving a first read voltage offset corresponding to the temperature from a look-up table.

14. The method of claim 13, wherein setting the first read voltage includes applying the first read voltage offset to a default value of the first read voltage.

15. The method of claim 10, wherein performing the storage verification operation further includes setting a second read voltage at least partially based on the temperature, and wherein reading the data from the block uses the first read voltage and the second read voltage.

16. The method of claim 15, wherein setting the first read voltage includes applying a positive offset to a default value of the first read voltage, and wherein setting the second read voltage includes applying a negative offset to a default value of the second read voltage.

17. An apparatus comprising:
means for storing data;
means for adjusting a read voltage based on a temperature of the means for storing;
means for reading the stored data from the means for storing based on the adjusted read voltage to verify the stored data has been successfully stored in the means for storing data; and
means for performing a corrective action responsive to non-integrity of the stored data.

18. The apparatus of claim 17, further comprising means for storing a first read voltage offset and a second read voltage offset corresponding to a first temperature range.

19. The apparatus of claim 18, wherein the first read voltage offset is a positive offset and the second read voltage offset is a negative offset.

20. The apparatus of claim 18, further comprising means for generating error data corresponding to the data read from the means for storing.

* * * * *